US010061364B2

(12) United States Patent
Kobayashi et al.

(10) Patent No.: US 10,061,364 B2
(45) Date of Patent: Aug. 28, 2018

(54) METHOD FOR COOLING STORAGE DEVICE

(71) Applicant: Hitachi, Ltd., Tokyo (JP)

(72) Inventors: Toru Kobayashi, Tokyo (JP); Tadaharu Maeda, Tokyo (JP); Syun Nakayama, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/505,739

(22) PCT Filed: Oct. 28, 2014

(86) PCT No.: PCT/JP2014/078539
§ 371 (c)(1),
(2) Date: Feb. 22, 2017

(87) PCT Pub. No.: WO2016/067351
PCT Pub. Date: May 6, 2016

(65) Prior Publication Data
US 2017/0285698 A1 Oct. 5, 2017

(51) Int. Cl.
*H05K 7/20* (2006.01)
*G06F 1/20* (2006.01)
(Continued)

(52) U.S. Cl.
CPC ................ *G06F 1/20* (2013.01); *G06F 1/263* (2013.01); *G11B 33/142* (2013.01); *H05K 7/20145* (2013.01); *H05K 7/20154* (2013.01)

(58) Field of Classification Search
CPC . G06F 1/181–1/182; H05K 7/20218–7/20381;
(Continued)

(56) References Cited

U.S. PATENT DOCUMENTS 5,193,050 A * 3/1993 Dimmick ................ G06F 1/184 361/679.46
5,412,534 A * 5/1995 Cutts .................... G11B 33/142 361/679.46

(Continued)

FOREIGN PATENT DOCUMENTS

JP 2008-016137 A 1/2008
JP 2008-147299 A 6/2008
JP 2008-251067 A 10/2008

OTHER PUBLICATIONS

International Search Report of PCT/JP2014/078539 dated Feb. 3, 2015.

*Primary Examiner* — Anthony Haughton
*Assistant Examiner* — Razmeen Gafur
(74) *Attorney, Agent, or Firm* — Mattingly & Malur, PC

(57) ABSTRACT

The present invention aims at improving a cooling efficiency and a maintenance workability related to heat generating components in a storage subsystem. Therefore, the present invention provides multiple cooling fans configured to cool multiple components for operating the storage subsystem, a first wind direction panel defining a passage configured to blow a cooling air generated by the cooling fans to a first component, a second wind direction panel defining a passage configured to blow a cooling air generated by the cooling fans to a second component having a smaller heating value than the first heat generating component and having a low temperature, and a chassis configured to store the multiple components, the cooling fans and the first and second wind direction panels, wherein the second wind direction panel is configured to be integrated with a side wall of the chassis and detachable from the chassis.

15 Claims, 11 Drawing Sheets

(51) Int. Cl.
*G11B 33/14* (2006.01)
*G06F 1/26* (2006.01)
*H01L 23/473* (2006.01)

(58) Field of Classification Search
CPC ........................ H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS 5,796,580 A * 8/1998 Komatsu ............ H05K 7/20727 361/679.47
6,058,011 A * 5/2000 Hardt ....................... G06F 1/183 165/104.33
6,466,441 B1 * 10/2002 Suzuki ............... H05K 7/20154 165/104.33
6,496,366 B1 * 12/2002 Coglitore .................. G06F 1/18 174/377
6,888,725 B2 * 5/2005 Kubo ........................ G06F 1/20 257/721
6,912,129 B2 * 6/2005 Baker ....................... G06F 1/20 165/80.3
6,924,977 B2 * 8/2005 Bestwick ................ G06F 1/183 165/121
7,061,761 B2 * 6/2006 Tucker ...................... G06F 1/20 165/104.33
7,542,288 B2 * 6/2009 Lanus ................ H05K 7/20563 361/695
7,636,239 B2 * 12/2009 Katakura ........... H05K 7/20736 361/694
8,068,340 B1 * 11/2011 Nguyen .............. F04D 25/0613 165/80.3
9,170,615 B2 * 10/2015 Wilke ................ H05K 7/20727
9,392,733 B2 * 7/2016 Day ................... H05K 7/20745
9,438,087 B2 * 9/2016 Czamara ................... F03D 9/00
2002/0054479 A1 * 5/2002 Wu .................... H05K 7/20727 361/695
2003/0221817 A1 * 12/2003 Smith ..................... G06F 1/181 165/80.3
2004/0025515 A1 * 2/2004 Evans ..................... F25B 21/02 62/3.2
2004/0184233 A1 * 9/2004 Yamada ............. H05K 7/20572 361/690
2005/0237714 A1 * 10/2005 Ebermann .......... H05K 7/20754 361/695
2007/0217164 A1 * 9/2007 Fujioka ..................... G06F 1/20 361/721
2008/0007912 A1 1/2008 Matsushima et al.
2008/0094802 A1 * 4/2008 Kumagai ................ G06F 1/203 361/709
2008/0106864 A1 * 5/2008 Merino ................... G06F 1/181 361/688
2008/0218965 A1 * 9/2008 Tokunaga ........... H01L 23/3677 361/688
2008/0239656 A1 10/2008 Sasagawa et al.
2009/0040714 A1 * 2/2009 Yamada .................... G06F 1/20 361/679.48
2009/0086430 A1 * 4/2009 Kang ................ G02F 1/133385 361/695
2011/0176271 A1 * 7/2011 Zhang ....................... G06F 1/20 361/679.33
2012/0243175 A1 * 9/2012 Okada ................ H05K 7/20745 361/690
2013/0231039 A1 * 9/2013 Nagasaka ............ H05K 5/0213 454/184
2015/0138717 A1 * 5/2015 Herman .................. G06F 1/181 361/679.32
2016/0288609 A1 * 10/2016 Yamaoka ........... B60H 1/00021

* cited by examiner

METHOD FOR COOLING STORAGE DEVICE

TECHNICAL FIELD

The present invention relates to a method for cooling a storage subsystem.

BACKGROUND ART

A storage subsystem is a device providing storage areas of data processed by application software operating in host computers (hereinafter abbreviated as hosts) such as servers and general purpose computers. The storage subsystem is provided with a large number of physical storage devices, and a control unit generating logical storage areas from the physical storage areas provided by the physical storage devices and controlling data input/output processing between the logical storage areas and the hosts. The physical storage devices can be 2.5-inch or 3.5-inch HDDs (Hard Disk Drives), for example.

In the control unit of the storage subsystem, electronic components such as MPUs (Micro Processor Units) for executing various control programs to execute the data input and output processing at high speed, memories for storing various data and programs, and communication interfaces for communicating with external devices and the like are formed on multiple circuit boards. Further, the storage subsystem includes a power supply for supplying power to the electronic circuits on the circuit boards and the HDDs, and a battery for supplying auxiliary power for saving data when power shutdown such as power failure occurs.

Recently, along with the increase of data storage capacity or the upgrading of the data input and output processing, the electronic circuit components are mounted with higher density on the circuit boards, the number of circuit boards being installed is increased, and high-speed MPUs are adopted, so that the amount of heat generated from the circuit boards stored in the storage control unit tends to be increased, so that there is a strong demand for a configuration capable of effectively cooling the circuit boards and components mounted thereon. A configuration is also known where the control unit, the physical storage device, the power supply and the battery are stored highly densely in a single chassis, and a plurality of such chassis are used to form a single storage subsystem.

For example, Patent Literature 1 discloses a technique for effectively cooling surface mounted components of such devices. Patent Literature 1 teaches a cooling structure of a heating body such as a CPU (Central Processing Unit) mounted on a printed board, the structure including a heat sink arranged to an upper portion of the heating body, and a cover covering the circumference of the heat sink, wherein cooling fans are arranged at both ends of a wind tunnel defined by the printed board and the cover to supply outer air into the wind tunnel and thereby cool the heating body.

CITATION LIST

Patent Literature

[PTL 1] Japanese Unexamined Patent Application Publication No. 2008-147299

SUMMARY OF INVENTION

Technical Problem

Along with the improvement of performance of the storage subsystem, the performance of high-performance processors are also improving, and by adopting such high-performance processors, the heating value of processors has also increased significantly. A large heat sink and a large fan must be provided to discharge the large heating value to the exterior. However, such large heat sink and large fan may not be installed due to the limited storage space within the storage subsystem.

With further reference to the art of Patent Literature 1, there is no consideration on the cooling of electronic components other than processors. Further, there is no consideration on blowing the cooling air from the cooling fan in a concentrated manner to the heat sink. In addition, during replacement of components including the cover for maintenance, there is fear that the maintenance crew may touch the heated heat sink, or the maintenance crew may forget to attach the cover, which causes abnormal temperature rise of the processor. Therefore, the object of the present invention is to improve the cooling efficiency and maintenance workability regarding the heat generating elements in a storage subsystem.

Solution to Problem

In order to solve the problems mentioned above, a typical method for cooling a storage subsystem according to the present invention includes multiple components configured to operate the subsystem, multiple cooling fans configured to cool the components, a first wind direction panel defining a passage configured to blow a cooling air generated by the cooling fans onto a first component, a second wind direction panel defining a passage configured to blow a cooling air generated by the cooling fans to a second component having a smaller heating value than the first heat generating component and having a low temperature, and a chassis configured to store the multiple components, the cooling fans and the first and second wind direction panels, wherein the second wind direction panel is configured to be integrated with a side wall of the chassis in a detachable manner from the chassis.

Advantageous Effects of Invention

According to the method for cooling the storage subsystem of the present invention, improvement of maintenance workability, prevention of touching the heat generating components during maintenance and replacement operation and abnormal increase of temperature of processor caused by the user or the like forgetting to attach the wind direction panel, reduction of rotation speed of cooling fans by improved cooling efficiency, and reduction of noise of the subsystem, can be achieved. The problems, configuration and effects other than those described above will become apparent from the following description of the preferred embodiments.

DESCRIPTION OF EMBODIMENTS

Figure 1:
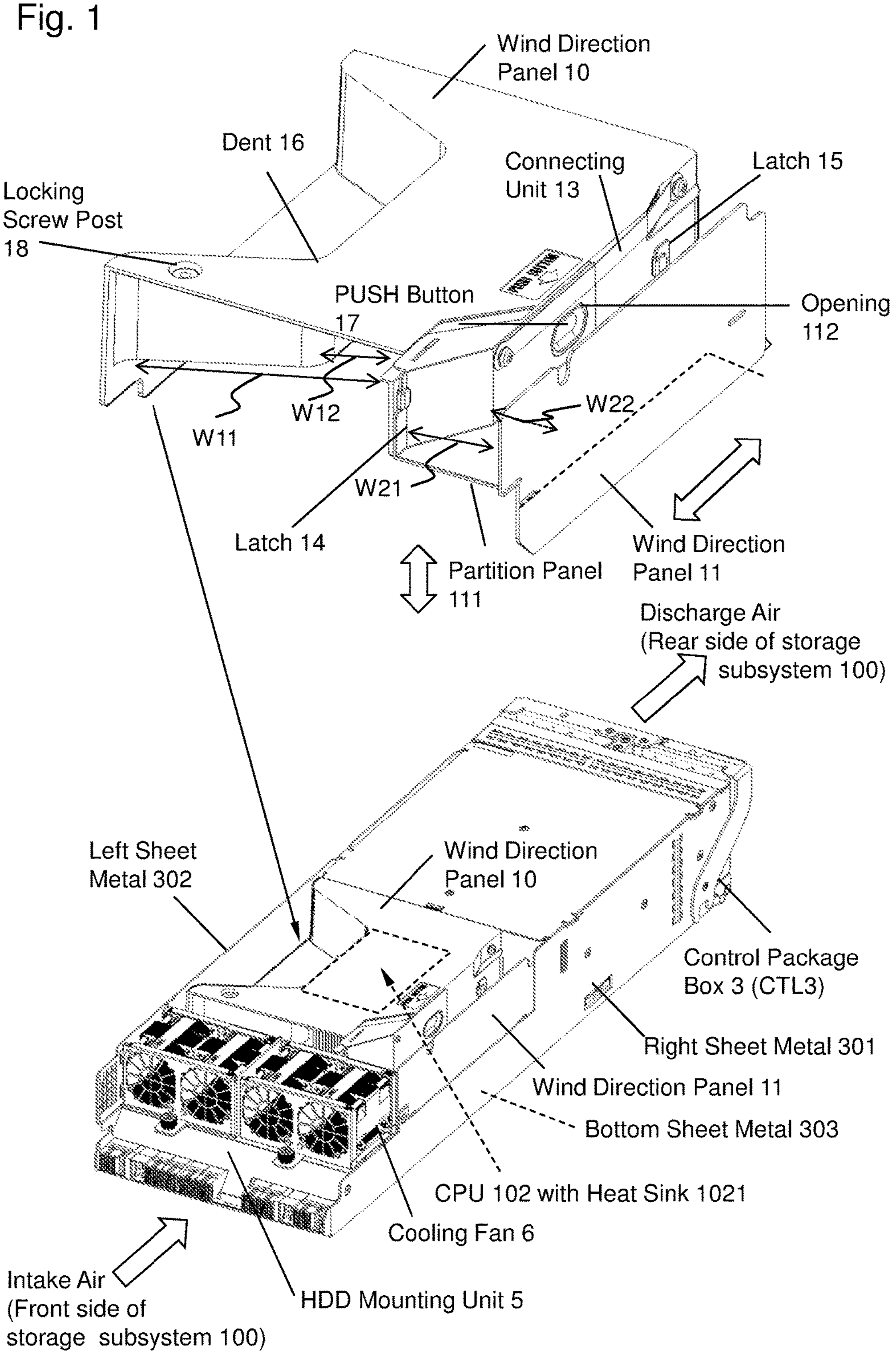
FIG. 1 is a configuration diagram illustrating an outline of the present invention.

Now, the preferred embodiments of the present invention will be described with reference to the drawings. In the following description, various elements can be identified via numbers, but names or other types of identification information can also be used as long as the respective elements can be identified. The equivalent elements are denoted with the same reference numbers in the drawings and the description of the present invention, but the present invention is not restricted to the present embodiments, and other modified examples in conformity with the idea of the present invention are included in the technical scope of the present invention. The number of each component can be one or more than one, unless defined otherwise.

Outline of Invention

FIG. 1 is a configuration diagram illustrating an outline of the present invention. One characteristic feature of the present invention is that a wind direction panel illustrated on an upper half of the drawing is attached to a control package box (hereinafter abbreviated as CTL) 3 illustrated on a lower half of the drawing in which electronic components which are heat generating components, such as a CPU, a memory, an HDD and a battery, are mounted and stored, to thereby cool the heat generating components efficiently. The CTL 3 is mounted to a basic chassis, and one or more basic chassis are stored in a storage subsystem to realize the roles of a storage device.

The wind direction panel is composed of a wind direction panel 10, a wind direction panel 11, and a connecting unit 13 joining the wind direction panel 10 and the wind direction panel 11 inseparably, and having a mechanism for preventing the wind direction panel 11 from being forgotten to be attached to the wind direction panel 1. The wind direction panel 10 has a substantially rectangular shape, and has a dent 16 formed near a center section on the left side. The height of the dent 16 is lower than the height of the wind direction panel 10, and a clearance (space) is formed between a lower sheet metal 303 (or a base board 31, although not shown) formed on the outer side of the CTL 3, defining a cooling air duct. Further, a width W11 of the wind direction panel 10 near an introduction port of cooling air narrows toward the depth direction to a width W12 having substantially the same dimension as the width of a heat sink 1021 for cooling a CPU 102. The cooling air duct is formed to have the width W12 equal to or longer than the length of the heat sink 1021. Then, the width of the outlet is gradually widened from width W12 to width W11 near the outlet of cooling air.

The wind direction panel 10 has a latch 14 and a latch 15 for fixing the wind direction panel 11 to a given position on the wind direction panel 10. Further, a PUSH button 17 is provided, which is inserted to an opening 112 formed on the wind direction panel 11 when the wind direction panel 11 is attached to the given position on the wind direction panel 10. By having the wind direction panel 11 fit to the latches 14 and 15, and having the PUSH button 17 inserted to the opening 112, the wind direction panel 10 and the wind direction panel 11 can be fixed together. The wind direction panel 10 has a locking screw post 18 for screwing the wind direction panel 10 to the base board 31 or the lower sheet metal 303. The wind direction panel 10 can be securely fixed to the CTL 3 by screwing via the locking screw post 18.

The wind direction panel 11 has a first contact surface to be in contact with the wind direction panel 10, a second contact surface formed in parallel with the first contact surface, which comes into contact with a right side sheet metal 301 and is integrated with the right side sheet metal 301 to form the whole right side sheet metal, and a partition panel 111 joining the first and second contact surfaces and separating the cooling air into upper and lower directions.

A lower cooling air duct is formed by the partition panel 111 of the wind direction panel 11 for introducing cooling air from cooling fans 6 and cooling a cache memory 105 (not shown) mounted on the base board 31. At the same time, the partition panel 111 forms an upper cooling air duct for directly cooling a backup battery 130 (not shown) and other components mounted on a rear side of a storage subsystem 100 by the cooling air from the cooling fans 6. Further, the upper cooling air duct has a width W21 near the introduction port, and the width is gradually narrowed toward the depth direction to have a final width W22.

The partition panel 111 has a slope (dotted line section of the wind direction panel 11 in the drawing) inclined downward toward the depth direction from the area near a projection engaged to the latch 15. This slope is provided to cool the backup battery 130 and the like arranged at the lower area of the rear side of the storage subsystem 100 by the cool and heavy air. Further, the partition panel 111 has a function to prevent the mixing of cooling air having been warmed by the cache memory 105 installed to the lower cooling air duct and the cooling air maintaining its cold temperature passing through the upper cooling air duct. The details thereof will be described later.

The connecting unit 13 is formed for example of band-shaped resin or thin metal, wherein one end of the connecting unit 13 is connected to the wind direction panel 10 by a screw or the like so that the connecting unit 13 can be rotated, and the other end is connected to the wind direction panel 11 by a screw or the like so that the connecting unit 13 can be rotated.

The wind direction panel 10 and the wind direction panel 11 are mainly formed of a material such as heat-resistant epoxy resin or plastic, but it is also possible to form the wind direction panel 11 using a light-weight metal (such as aluminum) having a high thermal conductivity. By adopting such arrangement, it becomes possible to conduct the heat absorbed by the wind direction panel 11 to the sheet metal of the CTL 3 and to have the heat radiated therefrom.

The wind direction panel (wind direction panel 10 and wind direction panel 20) formed as described above is attached to the CTL 3, to thereby efficiently cool the heat generating components such as the electronic components and batteries, and have the heated cooling air discharged through the rear side of the storage subsystem 100 to thereby radiate heat. The CTL 3 extends from a front side of the storage subsystem 100 to the rear side thereof, having mounted thereon an HDD mounting unit 5 for mounting HDDs, the cooling fans 6, a high temperature section in which high heat-generating components such as the CPU 102 or the cache memory 105 are installed, a low temperature section in which an expansion board 32, a backup battery 130 and the like are installed, and a rear-side connector unit for connecting to hosts or other CTLs.

Air is taken in from a front side of the storage subsystem 100 through four cooling fans 6, and the intake air (cooling air) first cools the HDDs on the HDD mounting unit 5. Using the cooling air having been warmed by cooling the HDDs, the CPU 102 having the greatest heating value and heated to a high temperature is first cooled by the air (cooling air) having an air quantity taken in through three cooling fans 6. The cache memory 105 is cooled by half the air of the air quantity taken in through the remaining one of the cooling fans 6, and the expansion board 32 mounted on the upper area at the rear side of the storage subsystem 100 is cooled by the cooling air having been heated and the cooling air heated by the CPU. Further, the backup battery 130 and the like is cooled by the remaining half of the air quantity taken in through the remaining one of the cooling fans 6. As described, efficient cooling is realized by blowing air to the heat generating components using the cooling air having appropriate temperature and air quantity according to the heating values and mounted positions of the respective generating components. The present embodiment illustrates an example where the heat generating components are cooled using four cooling fans 6, but the number of cooling fans 6 can be three or smaller, or five or greater.

<Exterior of Subsystem>

Figure 2:
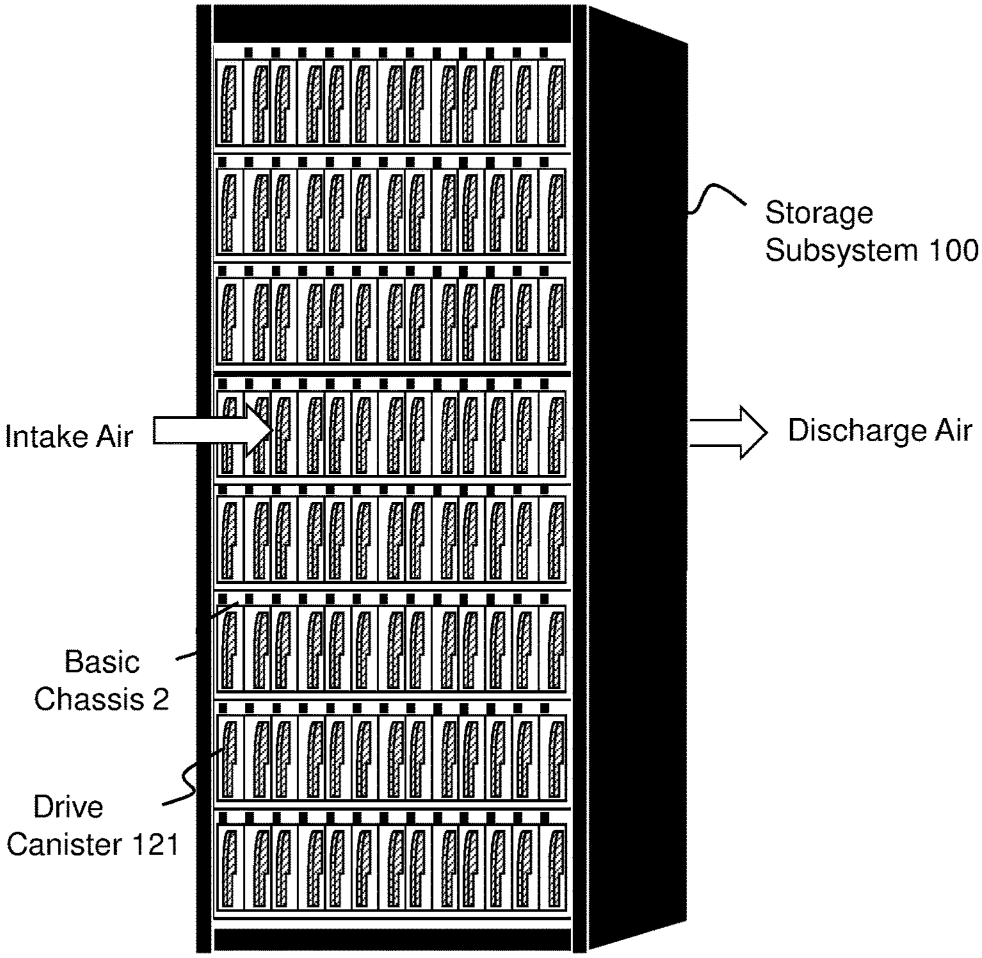
FIG. 2 is a view illustrating an external view of a storage subsystem according to the present embodiment.

FIG. 2 is a view illustrating an exterior of the storage subsystem 100 according to the preferred embodiment of the present invention. One or more basic chassis 2 (basic chassis 2*a* (FIG. 3) loading 2.5-inch HDDs or basic chassis 2*b* (FIG. 4) loading 3.5-inch HDDs, described later) are loaded in the storage subsystem 100 for storing data and information processed by a host or other superior devices. Although not shown, on the back side thereof are arranged wires such as a backend connection wire or cables that constitute a storage network. Multiple drive canisters 121 each having a single HDD installed therein are also mounted to the basic chassis 2.

The air for cooling the inner side of the storage subsystem 100 is taken in as outer air from the front side of the subsystem through the cooling fans 6 illustrated in FIG. 1. The various components such as the CPU 102, HDDs, memories, power supplies and batteries in the storage subsystem 100 are cooled by the intake outer air, and the heated air used for removing heat is discharged through the rear side of the subsystem. By performing this cooling operation, the storage subsystem 100 can be operated safely and normally.

<Basic Chassis Loaded with 2.5-Inch HDDs>

Figure 3:
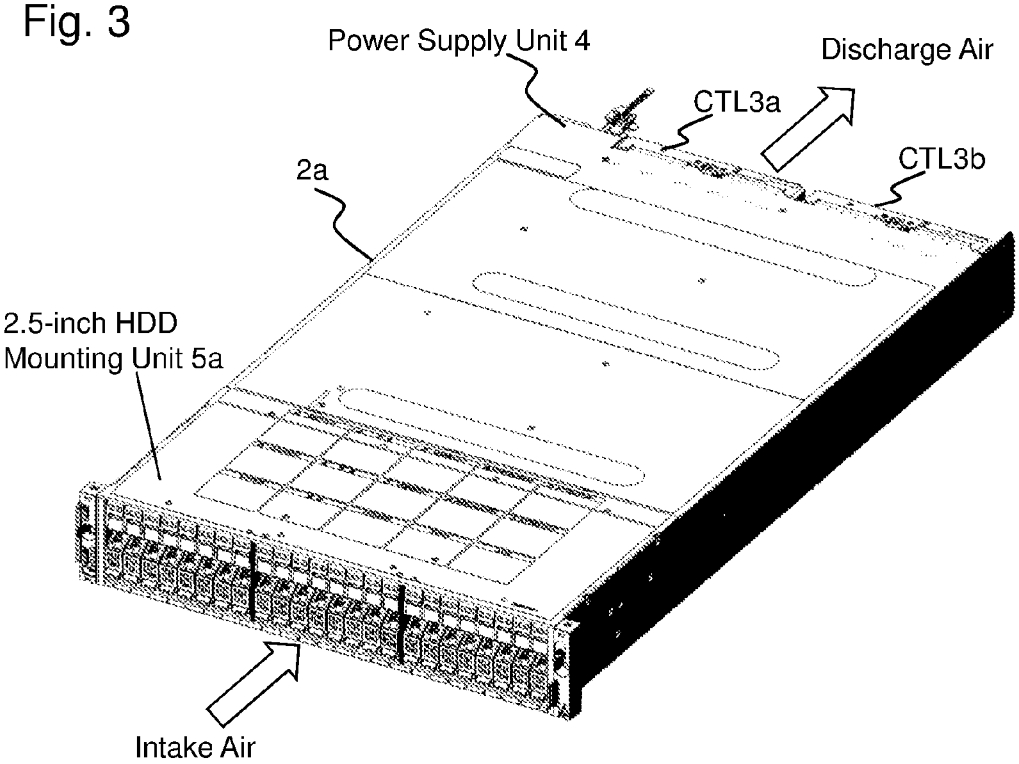
FIG. 3 is a perspective view illustrating a basic chassis having 2.5-inch HDDs loaded therein.

FIG. 3 is a perspective view illustrating a basic chassis loaded with 2.5-inch HDDs. The basic chassis 2*a* loaded with 2.5-inch HDDs is configured to load 20 to 30 2.5-inch HDD drive canisters in a 2.5-inch HDD mounting unit 5*a* positioned on the front side of the basic chassis (front side of the storage subsystem 100). Two power supply units 4 and two CTL units 3 (CTL 3*a* and CTL 3*b*) can be loaded from the rear side of the 2.5-inch HDD mounting unit 5*a* to the rear side of the storage subsystem 100.

<Basic Chassis Loaded with 3.5-Inch HDDs>

Figure 4:
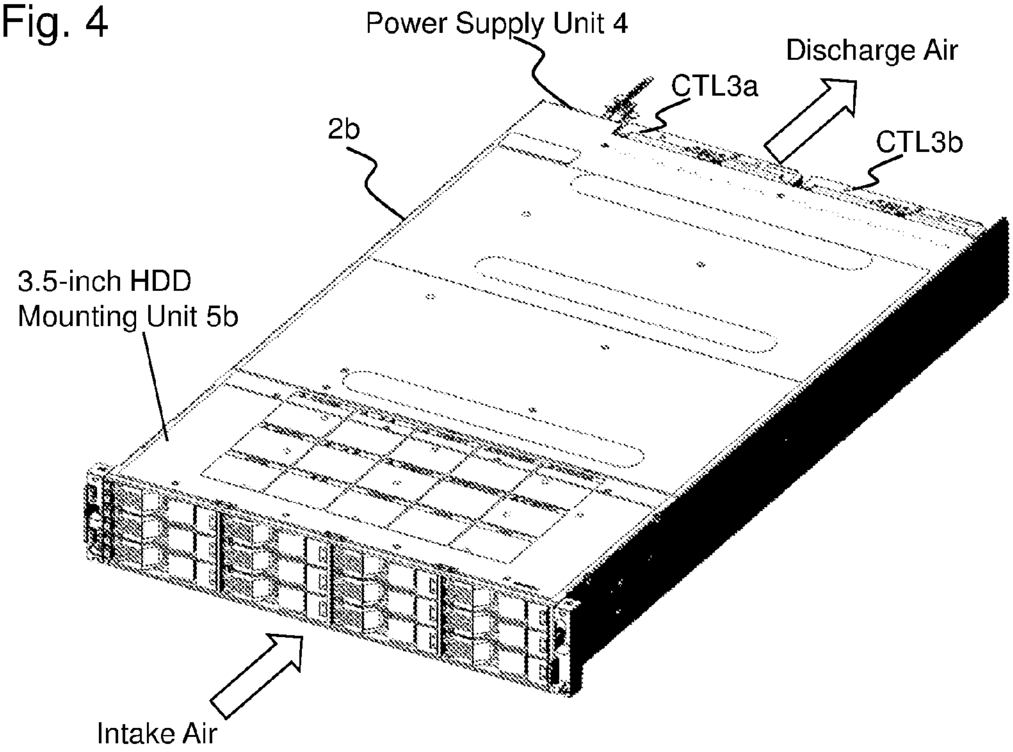
FIG. 4 is a perspective view illustrating a basic chassis having 3.5-inch HDDs loaded therein.

FIG. 4 is a perspective view illustrating a basic chassis loaded with 3.5-inch HDDs. The basic chassis 2*b* loaded with 3.5-inch HDDs is configured to load 10 to 15 3.5-inch HDD drive canisters in a 3.5-inch HDD mounting unit 5*b* positioned on the front side of the basic chassis (front side of the storage subsystem 100). Further, similar to the 2.5-inch HDD basic chassis 2*a*, two power supply units 4 and two CTL units 3 (CTL 3*a* and CTL 3*b*) can be loaded from the rear side of the 3.5-inch HDD mounting unit 5*b* to the rear side of the storage subsystem 100. The only difference between the basic chassis 2*a* loaded with 2.5-inch HDDs and the basic chassis 2*b* loaded with 3.5-inch HDDs is that the type of HDDs mounted on the front side of the basic chassis differs between the 2.5-inch type and the 3.5-inch type, and the components mounted on the rear side section are the same.

<Rear Side Configuration>

Figure 5:
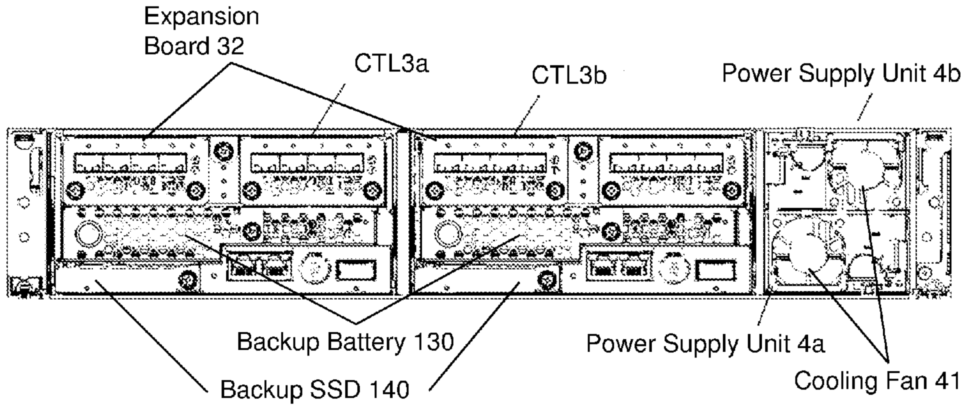
FIG. 5 is a rear view of the basic chassis.

FIG. 5 is a rear side view of the basic chassis. As illustrated in the drawing, CTL 3*a* and CTL 3*b* (mounted side by side in the width direction) and power unit 4*a* and power unit 4*b* (mounted one above the other in the vertical direction) are arranged on the basic chassis 2*a*/2*b*. A backup battery 130 composed of an expansion board 32 and a chargeable secondary battery (such as a Nickel-Metal Hydride (Ni-MH) type secondary battery) is provided on the rear side of the CTL 3*a* and the CTL 3*b*, respectively.

Further, power supply unit 4*a* and power supply unit 4*b* are each provided with an electronic circuit such as a DC/DC converter for generating various DC voltages including the drive voltage of the CPUs, HDDs and memories of the CTL 3*a* and CTL 3*b* or the charging voltage for charging batteries, and a cooling fan 41 dedicated to cool the electronic components thereof. If the inner temperature of the Ni-MH secondary battery rises, deterioration such as the reduction of chargeable capacity or the reduction of chargeable-dischargeable times occurs, so it is also important to cool the secondary battery. Generally, counter-rotatable fans capable of realizing high air quantity and high static pressure are used as the cooling fans 6 and the cooling fans 41.

<Internal Configuration of CTL>

Figure 6:
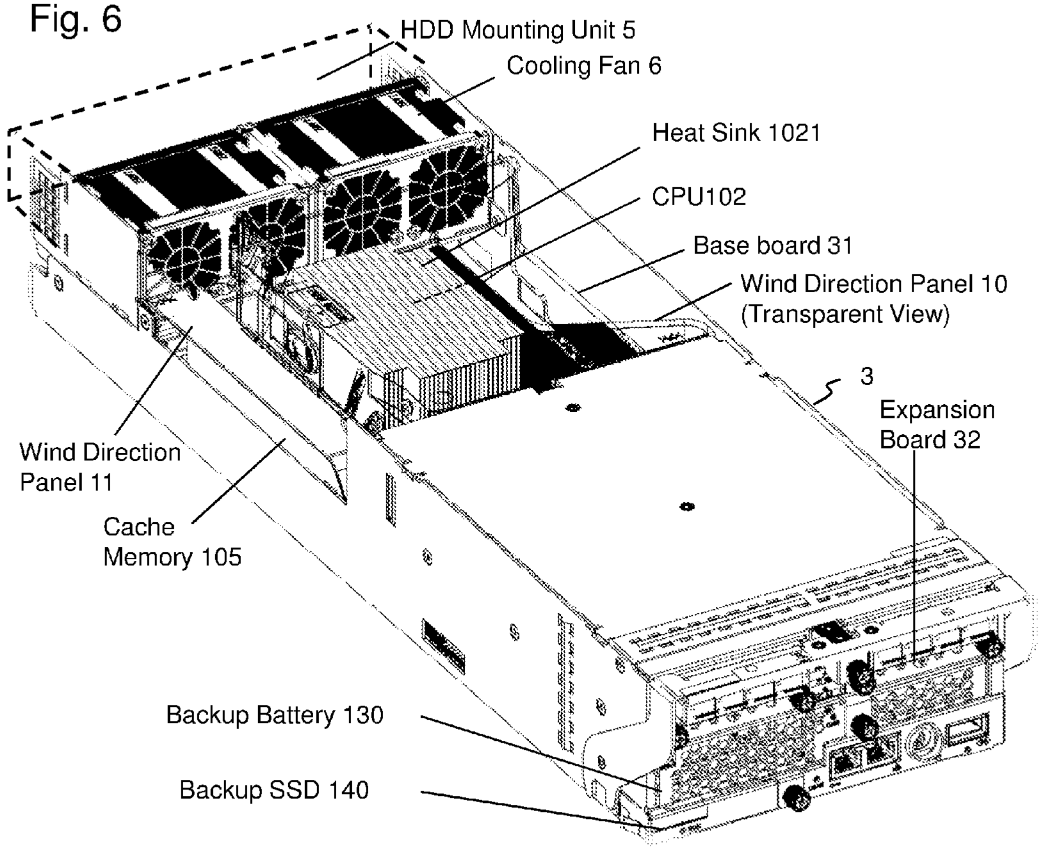
FIG. 6 is a view illustrating an internal configuration of a control package box (CTL).

FIG. 6 is a view illustrating an internal configuration of a control package box (CTL). The control package box (CTL) 3 has loaded therein, from the front side of the storage subsystem 100 toward the rear side of the storage subsystem 100 in the named order, the HDD mounting unit 5, the cooling fan 6, the CPU 102 and the cache memory 105 mounted on the base board 31, and the expansion board 32, the backup battery 130 and the backup SSD 140. On the right side of the CPU 102 above the base board 31 is arranged a high-speed bus line through which data is transferred at a transfer rate of a few Gbps (Giga bit per second) or higher, such as PCI-e (Registered Trademark) or SAS interface.

The heating value of the CPU 102 operating at a frequency of a few GHz is extremely high, so that a large-sized heat sink 1021 as shown in the drawing is provided near the cooling fans 6, which is cooled by a temperature close to the outside air temperature of the storage subsystem 100 (actually, the air has already cooled the HDDs, so that the temperature is higher by approximately 10 degrees than the outside air temperature). Further, the cache memory 105 is also an electronic component operating at a frequency of a few GHz or greater, and the heating value thereof is also high. In order to effectively cool the CPU 102 and the cache memory 105, the wind direction panel provided with the wind direction panel 10 described in FIG. 1 (shown transparently in FIG. 6) and the wind direction panel 11 is mounted above the CPU 102 and the cache memory 105 to cover these electronic components.

Not only a maintenance crew but also the user having purchased or rented the storage subsystem 100 can perform maintenance and replacement of the cache memory 105, the expansion board 32, the backup battery 130 and the backup SSD 140, so that there is fear that the maintenance and replacement operation is carried out while the heat sink 1021 near the cache memory 130 is heated. Therefore, according to the present embodiment, the high temperature components are covered by the wind direction panel 10 as described in FIG. 1, and the wind direction panel 10 is fixed to the CTL 3 via a screw and the like to prevent the user or the maintenance crew from touching the high-temperature component. Further, the wind direction panel 11 adopts a configuration where it can be removed from the CTL 3, but fixed inseparably to the wind direction panel 10 via the connecting unit 13.

Figure 12:
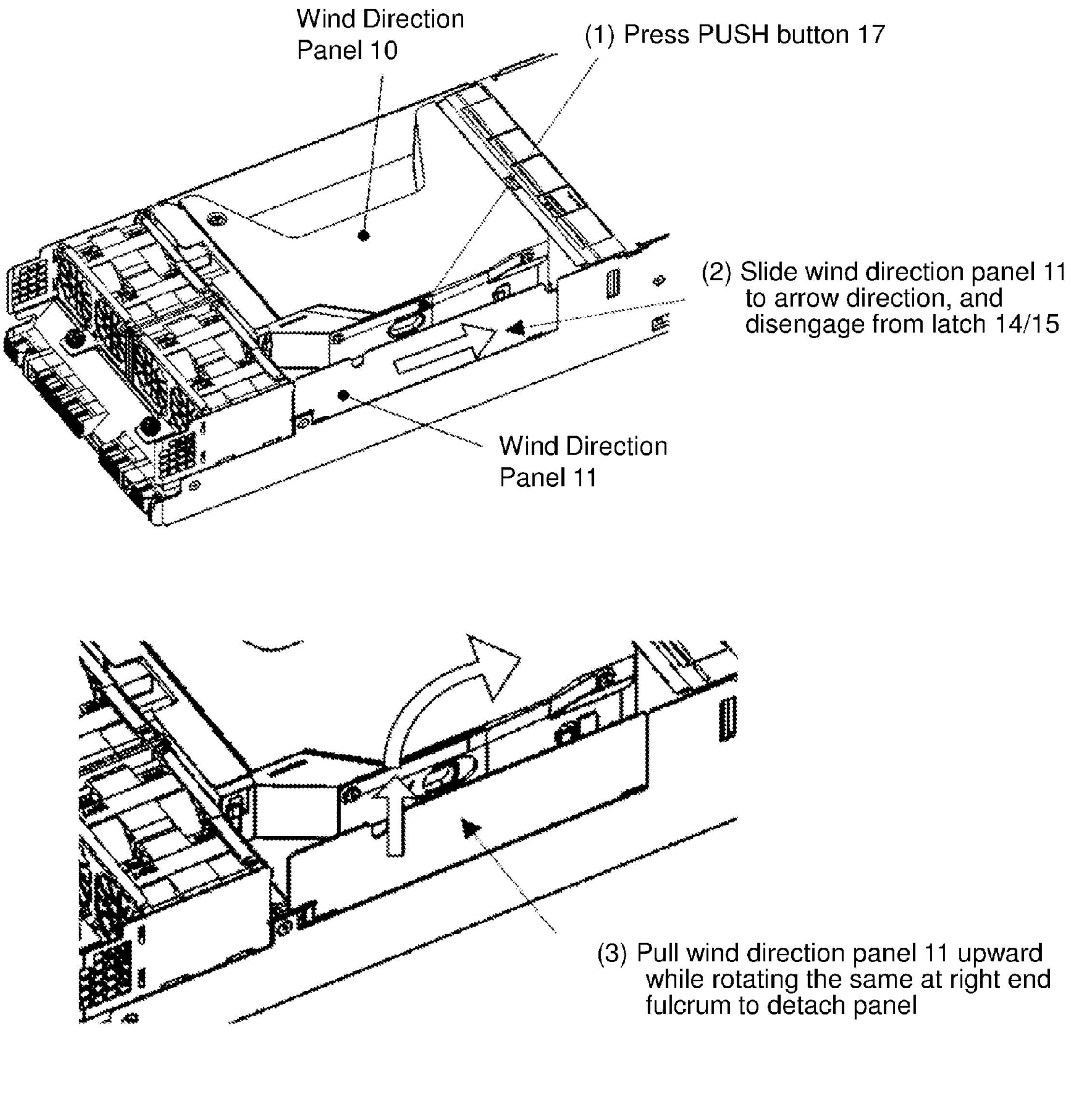
FIG. 12 is a view illustrating how a wind direction panel is attached and detached.

For example, in replacing or additionally mounting the cache memory 105, the cache memory 105 module is mounted to the base board 31 via a connector, but since the mounting position thereof is lower than the wind direction panel 11, the replacement or additional mounting operation can be easily performed by having the wind direction panel 11 arranged in a detachable manner. The method for detaching the wind direction panel 11 will be described later (FIG. 12). The major electronic components installed in the storage subsystem 100 will be described with reference to FIG. 7.

<System Configuration and Outline of Invention>

Figure 7:
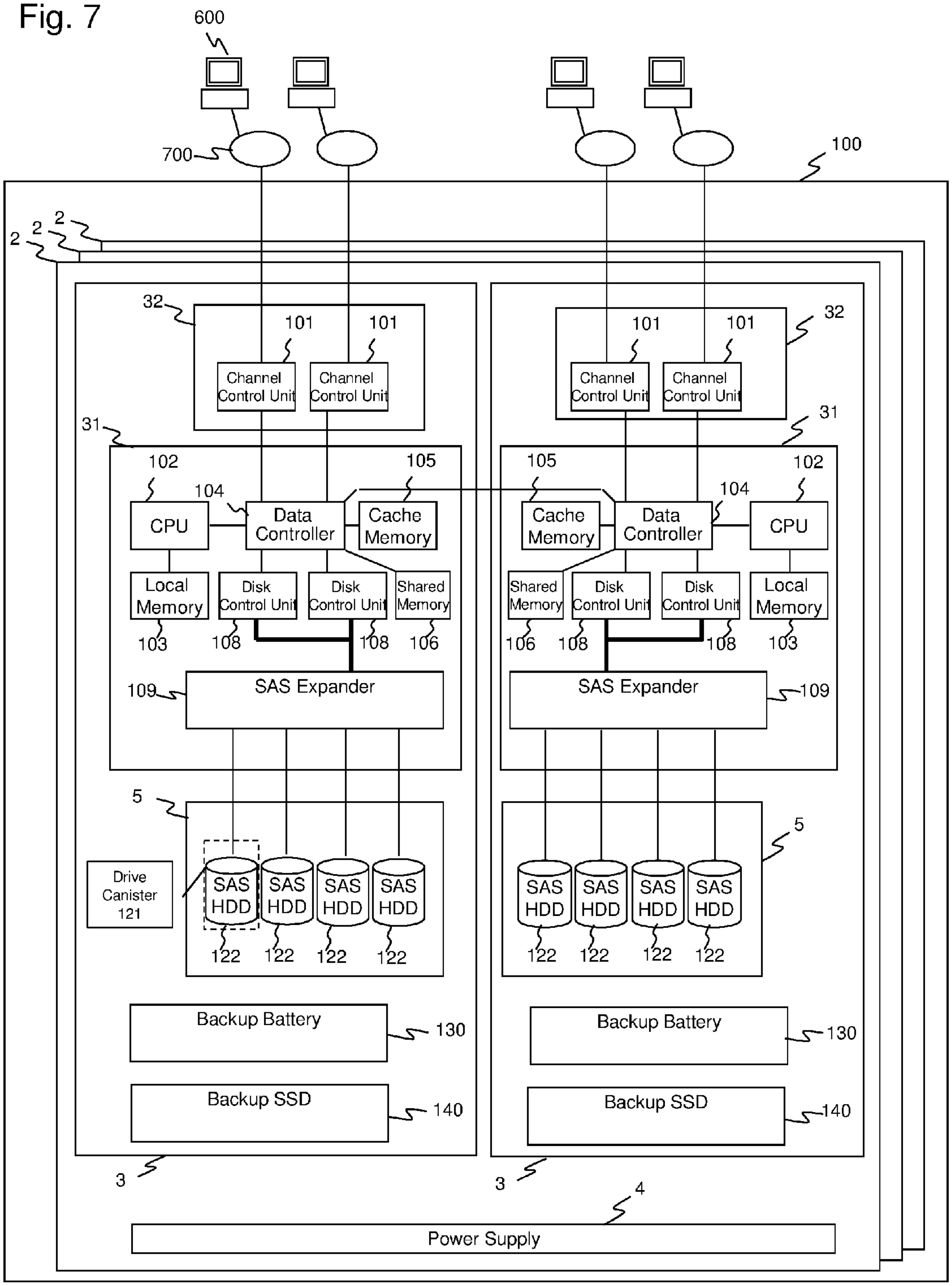
FIG. 7 is a view illustrating a hardware configuration of a storage subsystem.

FIG. 7 is a view showing a hardware configuration of the storage subsystem. The storage subsystem 100 is connected to hosts 600 via networks 700. The storage subsystem 100 is equipped with one or more basic chassis 2. The basic chassis 2 includes one or more CTLs 3 and one or more power supply units 4, as described earlier. The CTL 3 is equipped with a base board 31, an expansion board 32, and an HDD mounting unit 5 loaded with a drive canister 121 including one HDD (such as a SAS type HDD 122), a backup battery 130, and a backup SSD 140.

The base board 31 includes a CPU 102, a local memory 103, a data controller 104, a cache memory 105, a shared memory 106, a disk control unit 108 and a SAS expander 109. These components are loaded either directly on a printed board or via connectors or sockets.

The CPU 102 is a processor controlling the whole storage subsystem 100. The local memory 103 is configured to store various programs and various tables executed by the CPU 102. The data controller 104 is a controller configured to transfer data and commands among the CPU 102, the various control units and the various memories.

The cache memory 105 is a memory configured to temporarily store user data from the hosts 600 or the SAS type HDDs 122 or control information of the storage subsystem 100. The shared memory 106 is a memory storing control information and the like used in a shared manner by the respective processors and controllers. The disk control unit 108 is a controller configured to transmit and receive data to/from the SAS type HDDs 122. The SAS expander 109 is a controller having multiple SAS ports for connecting multiple SAS type HDDs. The type of the HDDs can be a SATA type HDD or SSD, in addition to the illustrated SAS type HDD 122.

The disk control units 108 and the SAS expander 109 are connected via eight wide links (eight circuits), which enable high-speed transfer as fast as 12 Gbps per single circuit, as according to SAS-3 standards. The SAS expander 109 and the SAS type HDDs 122 are also connected via four wide links (four circuits), and similar to the connection between the disk control units 108 and the SAS expander 109, high-speed transfer as fast as 12 Gbps per single circuit is enabled. Such high-speed bus lines are collectively wired to the side wall of the CPU 102 (near the lower section of the dent 16 of the wind direction panel 10) on the base board 31 as described earlier.

Channel control units 101 of the expansion board 32 are controllers for transmitting and receiving user data and configuration information to/from the host 600. As described above, a large number of electronic components are included in the storage subsystem, each of which are heated by operation, creating a heat quantity heating the inner temperature of the storage subsystem 100, the basic chassis 2 and the CTL 3, and the temperature may exceed the rated temperature range of operation of the respective components, resulting in damage or other failures and deterioration and reducing the life of the subsystem. Therefore, cooling is performed efficiently via the wind direction panel according to the preferred embodiment of the present invention.

<Cooling Air Passage>

<Whole body of Basic Chassis>

Figure 8:
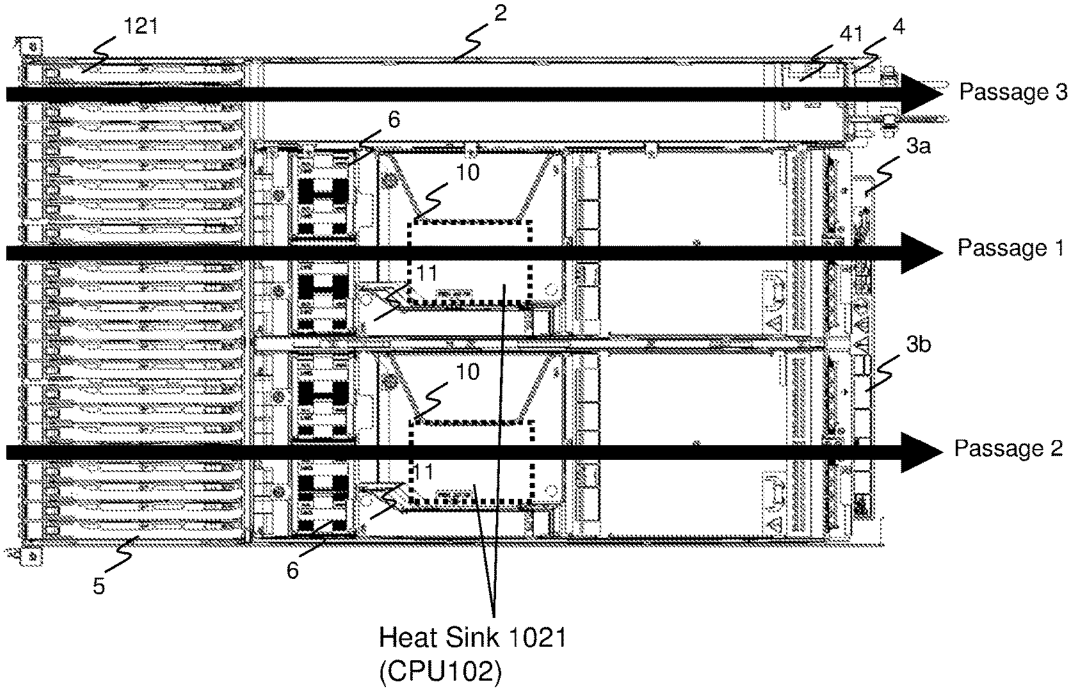
FIG. 8 is a view illustrating cooling air passages in the basic chassis.

FIG. 8 is a view illustrating cooling air passages in the basic chassis. The basic chassis 2*a*/2*b* (basic chassis 2) cools the whole chassis using the cooling fans 6 of the CTL 3*a* and CTL 3*b* and the cooling fans 41 of the power supply unit 4. There are three main passages constituting the cooling structure for cooling the whole basic chassis 2*a*/2*b*. A passage 1 is provided through which air is flown from the front side of the storage subsystem 100 toward the rear side to cool the HDDs 122 and the CTL 3*a*. Next, a passage 2 is provided through which air is flown from the front side of the storage subsystem 100 toward the rear side to cool the HDDs 122 and the CTL 3*b*. Finally, a passage 3 is provided through which air is flown from the front side of the storage subsystem 100 toward the rear side to cool the HDDs 122 and the power supply unit 4*a*/4*b*.

Since multiple HDDs 122 are loaded on the front side of the storage subsystem 100, wind (air) having been warmed after cooling the HDDs 122 flows into the respective passages. The temperature of the warmed wind (air) is approximately 10 degrees higher than the circumference temperature of the storage subsystem 100. Therefore, it is necessary to efficiently cool the CTL 3 and the power supply unit 4 using this warmed wind (air).

<Cooling Air Passage within CTL>

Figure 9:
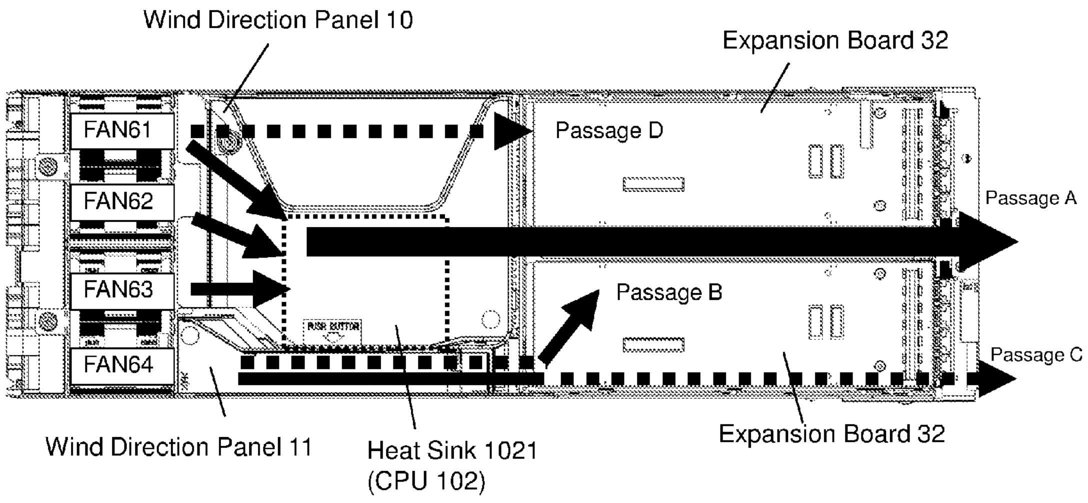
FIG. 9 is a view illustrating cooling air passages in the control package box (CTL) from the upper direction (upper view).
Figure 10:
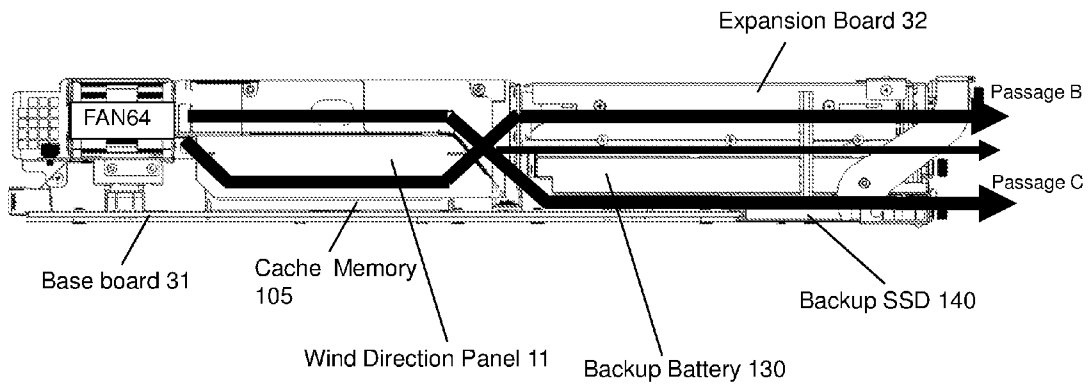
FIG. 10 is a view illustrating cooling air passages in the control package box (CTL) from the lateral direction (side view).

FIG. 9 is a view illustrating the cooling air passage in the control package box (CTL) from the upper direction (upper view). FIG. 10 is a view illustrating the cooling air passage in the control package box (CTL) from the lateral direction (side view).

The main heat generating components within the CTL 3 are, as described earlier, the CPU 102, the cache memory 105, the expansion board 32, the backup battery 130, the backup SSD 140 and other heat generating components such as controllers and memories.

Four cooling fans 6 (FAN 61, FAN 62, FAN 63 and FAN 64) are installed within the CTL 3 to cool these heat generating components and the HDDs 122. The assigning of performance (air quantity) of the cooling fans is determined as follows, based on the specification of heat generation of the cooling targets: passage A cools the CPU 102 and the expansion board 32, passage B cools the cache memory 105 and the expansion board 32, passage C cools the backup battery 130 and the backup SSD 140, and passage D cools the heat generating components disposed on the high-speed bus line side and the expansion board 32.

Passage C is composed of a path passing the upper area of the backup battery 130, and a path passing the lower area of the backup battery 130. Thereby, the backup battery 130 and the backup SSD 140 mounted perpendicularly (one above the other) can be cooled efficiently.

The power (air quantity) of the cooling fans corresponding to three fans, FAN 61, FAN 62 and FAN 63, are assigned to passage A, and a portion of the power (air quantity) is also assigned to passage D. Half the power of FAN 64 is assigned to passage B, and the remaining half of the power of FAN 64 is assigned to passage C. That is, the air quantity generated by FAN 64 is divided into two by the partition panel 111 of the wind direction panel 11, and each of the divided air quantities are passed through passage B and passage C.

As described, the CPU 102 and the cache memory 105, which are high-heat generating components, are arranged as high temperature sections near the cooling fan, and are cooled by the cooling air having its temperature raised after cooling the HDDs 122 but still having a temperature (T2) close to outside air temperature (T1) of the storage subsystem 100. Specifically, cooling air having an air quantity of approximately three cooling fans 6 is blown onto and removes heat from the heat sink 1021, which is a radiator plate of the CPU 102 generating the highest heating value among the electronic components.

Similarly, cooling air having a temperature (T2) close to outside air temperature is passed through passage B to cool the cache memory 105, which is also a high heat generating component, although not as high as the CPU 102.

Further, a low temperature section in which low-heat generating components (expansion board 32, backup battery 130, backup SSD 140 and the like), that have smaller heating values compared to the CPU 102 and the cache memory 105, are arranged is disposed rearward in the direction of the passage of the high temperature section. The expansion board 32 of the low temperature section is cooled by the temperature (T3) having been raised at the high temperature section, but a total air quantity of passage A, passage B and passage D, in other words, a large amount of cooling air having an air quantity of three-and-a-half cooling fans 6, is used for cooling the components. In addition, the backup battery 130 and the backup SSD 140 can be cooled by the cooling air having a temperature (T2) close to outside air temperature (T1) (passage C).

As described, passage A and passage D are defined by the wind direction panel 10, and passage B and passage C are defined by the wind direction panel 11, so that the high heat generating components of the high temperature section and the low heat generating components of the low temperature section can be cooled efficiently. Therefore, failure of components and promotion of deterioration caused by abnormal temperature rise can be suppressed, and the availability of the storage subsystem 100 can be improved.

Figure 11:
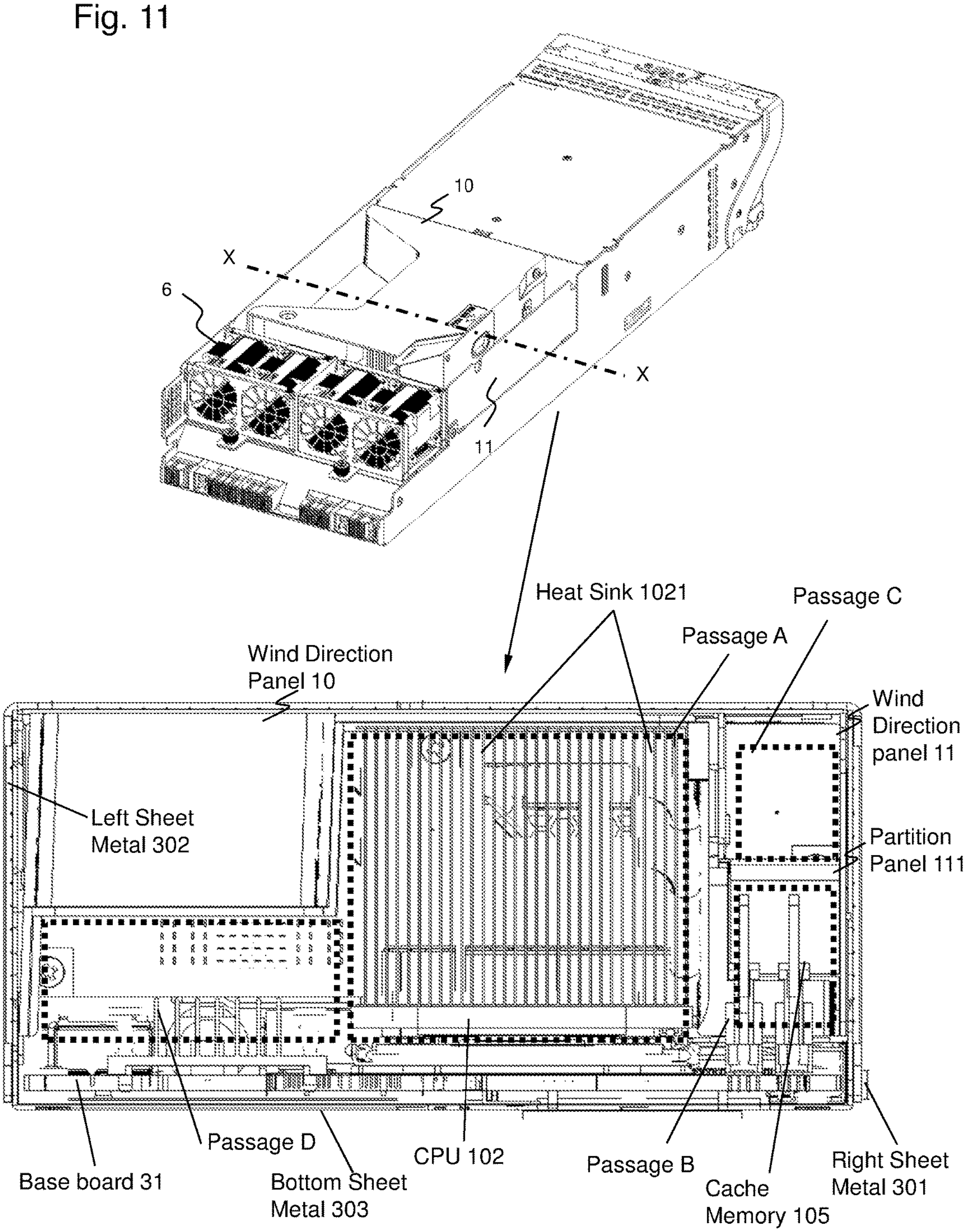
FIG. 11 is a cross-sectional view illustrating cooling air passages in the control package box (CTL).

FIG. 11 is a cross-sectional view showing the cooling air passages in the control package box (CTL). The wind direction panel 10 forms an air introduction passage to passage A for cooling the heat sink 1021 disposed on the CPU 102 and to passage D for cooling the high-speed bus line side of the base board 31, and the wind direction panel 11 forms an air introduction passage to passage B for cooling the cache memory 105 and to passage C for cooling the backup battery 130 and the like. In addition, the wind direction panel 11 also has a function to define both the air introduction passage and a portion of the outer wall of the CTL 3.

<Method for Attaching/Detaching Wind Direction Panel>

FIG. 12 is a view illustrating a method for attaching/detaching the wind direction panel. The method for detaching the wind direction panel 11 is as follows:

(1) Press the PUSH button 17.

(2) Slide the wind direction panel 11 toward the direction of the arrow, and disengage the panel from the latch 14/15;

(3) Pull the wind direction panel 11 upward while rotating the same at the right end fulcrum to remove the panel.

This operation enables the memory module of the cache memory 105 to be exposed, so that replacement thereof becomes possible. Further, the method for attaching the wind direction panel 11 is performed in the opposite order as the steps for detaching the panel described above.

<Prevention of Incorrect Insertion of Wind Direction Panel>

Figure 13:
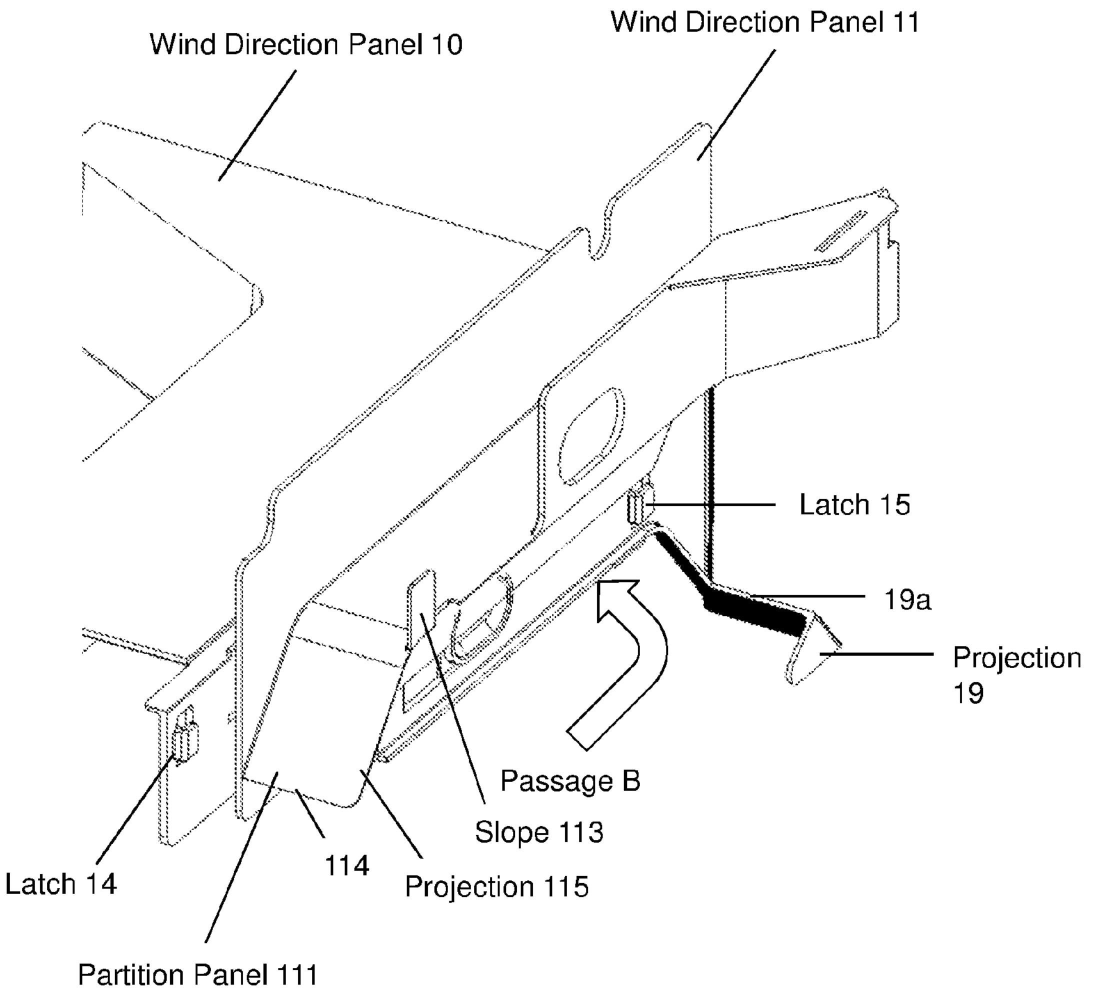
FIG. 13 is a view illustrating how incorrect insertion of the wind direction panel is prevented.

FIG. 13 is a view showing how incorrect insertion of the wind direction panel is prevented. The removal of the wind direction panel 11 is not only performed by a professional maintenance crew but also by users, so that when attaching the wind direction panel 11 after maintenance is completed, the wind direction panel 11 must be mounted on the wind direction panel 10 at a correct given position reliably with respect to the CTL 3. Therefore, the wind direction panel 11 has an asymmetric shape in the vertical and horizontal directions, as shown in FIG. 13. The structure of the wind direction panel 11 having an asymmetric shape prevents the panel 11 from being engaged with or fixed in the wrong direction to the latch 14 and the latch 15 placed at the area for fixing the wind direction panel 11 to the wind direction panel 10. In other words, a structure is adopted where the wind direction panel 10 and the wind direction panel 11 cannot be fixed and joined to each other unless a projection 115 is engaged with the latch 15.

Further, an end portion 114 of a slope 113 of the wind direction panel 11 comes into contact with (or connects with) and is integrated with a contact surface 19*a* on a projection 19 of the wind direction panel 10, so that it functions as a wall against cooling air in passage B. Therefore, the cooling air in passage B flows toward the left direction, as shown in FIG. 13. Further, since it functions as a wall against cooling air in passage B, it prevents cooling air flowing through passage B that has been lightened by the rising in temperature from mixing with the cold and heavy cooling air flowing through passage C.

<Prevention of Incorrect Insertion of Wind Direction Panel>

Figure 14:
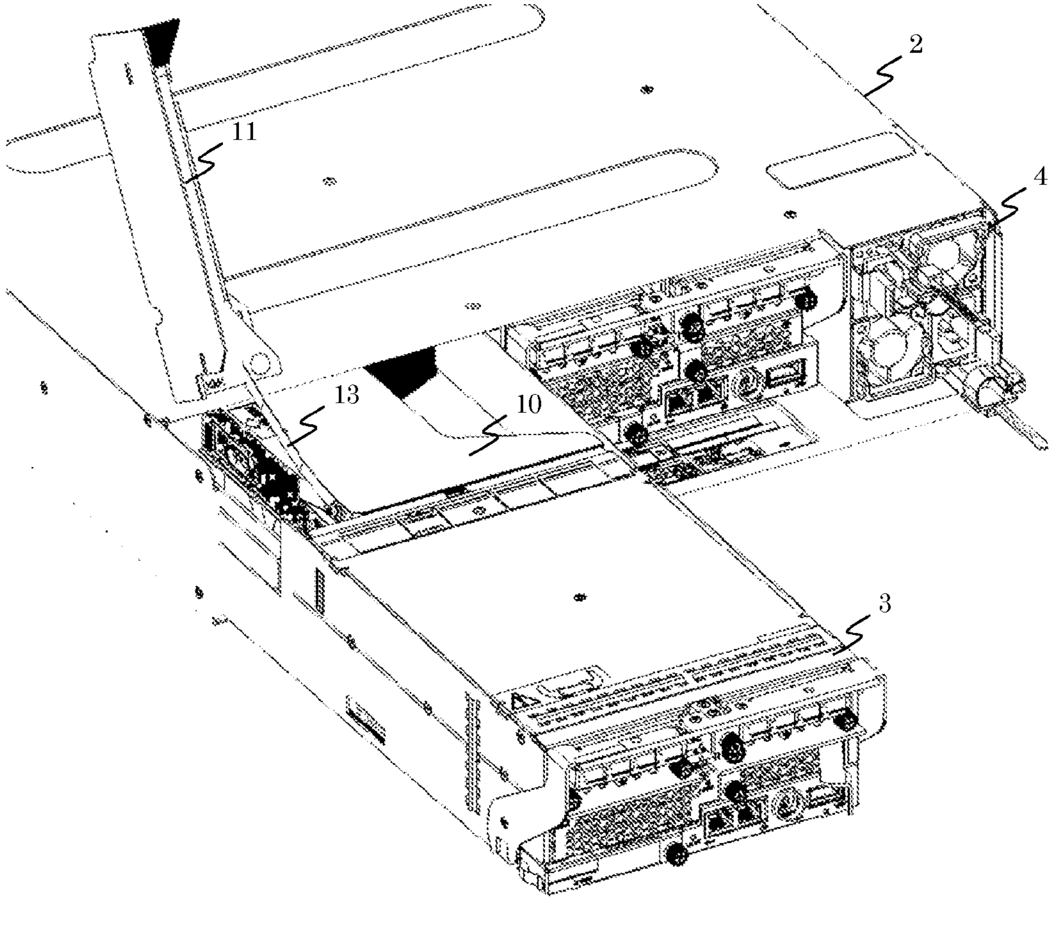
FIG. 14 is a view illustrating how incorrect insertion of the control package box (CTL) is prevented when the wind direction panel is not attached.

FIG. 14 is a view illustrating how incorrect insertion of the control package box (CTL) is prevented when the wind direction panel is not attached.

An interlock mechanism is provided, which prevents insertion of the CTL 3 to the basic chassis 2 if the maintenance crew or the user forgets to attach the wind direction panel 11 after completing maintenance. In other words, according to the present structure, if the wind direction panel 11 is not attached, the connecting unit 13 that joins the wind direction panel 10 and the wind direction panel 11 together will be caught between the CTL 3 and the basic chassis 2, preventing the CTL 3 from being completely inserted to the basic chassis 2. By adopting this structure, the user or the like can recognize that he/she has forgotten to attach the wind direction panel 11. Further, the present interlock mechanism is also capable of achieving the effect of preventing forgetting of attaching the panel 11, by providing a hinge or other mechanical components that may be adopted instead of the illustrated band-like connecting unit 13.

As described, an efficient cooling of the CTL 3 and the basic chassis 2 in the storage subsystem 100 can be realized by joining the wind direction panel 10 fixed to the CTL 3 and the detachable wind direction panel 11 via the connecting unit 13, and controlling the air quantity of the cooling air blown to the heat generating components through the wind direction panel 10 and the wind direction panel 11. Further, by covering the high heat generating component with the wind direction panel 10 fixed to the CTL 3, it becomes possible to prevent contact with the high heat generating component (heat sink 1021 of CPU 102) heated to a high temperature mounted near the detachable wind direction panel 11 during replacement of components (such as the cache memory 105). Further, it becomes possible to prevent forgetting of attaching of the wind direction panel 11 by the function of the connecting unit 13. Therefore, it becomes possible to prevent the abnormal temperature rise within the CTL 3 and failure of components caused by forgetting to attach the wind direction panel 11.

The present invention is not restricted to the above-illustrated preferred embodiments, and can include various modifications. The above-illustrated embodiments are described in detail to help understand the present invention, and the present invention is not restricted to a structure including all the components illustrated above. Further, a portion of the configuration of an embodiment can be replaced with the configuration of another embodiment, or the configuration of a certain embodiment can be added to the configuration of another embodiment. Moreover, a portion of the configuration of each embodiment can be added to, deleted from or replaced with other configurations. A portion or whole of the above-illustrated configurations, functions, processing units, processing means and so on can be realized via hardware configuration such as by designing an integrated circuit. Only the control lines and information lines considered necessary for description are illustrated in the drawings, and not necessarily all the control lines and information lines required for production are illustrated. In actual application, it can be considered that almost all the components are mutually coupled.

REFERENCE SIGNS LIST

2: Basic Chassis, 3: CTL, 4: Power Supply Unit, 6, 41: Cooling Fan, 10, 11: Wind Direction Panel, 13: Connection Unit, 14, 15: Latch, 100: Storage Subsystem, 102: CPU, 105: Cache Memory, 111: Partition Panel

The invention claimed is:

1. A storage subsystem configured to store data of an external device, comprising:

a plurality of components configured to operate the subsystem;

a plurality of cooling fans configured to generate a cooling air to cool the components;

a first wind direction panel which defines a first passage configured to direct the cooling air generated by the cooling fans to a first component of the plurality of components;

a second wind direction panel which defines a second passage configured to direct the cooling air generated by the cooling fans to a second component, of the plurality of components, having a smaller heating value than the first component and having a lower temperature than the first component;

a chassis configured to store the components, the cooling fans and the first and second wind direction, wherein the first wind direction panel is fixed to the chassis, wherein the second wind direction panel is configured to be integrated with a side wall of the chassis and detachable from the chassis, wherein the first component is mounted at a position closer to the cooling fans than the second component, wherein the cooling air generated by the cooling fans is divided into a first air quantity passing through the first passage defined by the first wind direction panel and a second air quantity passing through the second passage defined by the second wind direction panel, and wherein the first air quantity is greater than the second air quantity.

2. The storage subsystem according to claim 1, further comprising:

a connecting body configured to join the first wind direction panel and the second wind direction panel when the second wind direction panel is integrated with the side wall of the chassis.

3. The storage subsystem according to claim 1, further comprising:

a plurality of storage devices configured to store the data of the external device and which are loaded in the chassis, wherein the cooling fans are disposed between the storage devices and the first and second components, wherein the storage devices are cooled by air taken in from an exterior of the storage subsystem by the cooling fans, and wherein the air having cooled the storage device is blown from the cooling fans to the first component via the first wind direction panel to cool the first component, and to the second component via the second wind direction panel to cool the second component.

4. The storage subsystem according to claim 3, wherein the first component is a processor configured to control the storage subsystem.

5. The storage subsystem according to claim 4, wherein the second component is one or more of the following: a volatile memory configured to temporarily store data of the external device, a backup nonvolatile memory configured to store the contents of the volatile memory, a backup battery configured to supply power for storing data to the backup nonvolatile memory when power supply from the exterior to the storage subsystem is cut off, and an expansion board equipped with a communication controller configured to communicate with the external device.

6. A method for cooling a storage subsystem storing data of an external device, the method comprising:

providing a plurality of components configured to operate the subsystem in a chassis;

providing a plurality of cooling fans configured to generate a cooling air to cool the components in the chassis;

providing a first wind direction panel which defines a first passage configured to direct the cooling air generated by the cooling fans to a first component of the plurality of components, where the first wind direction panel is fixed to the chassis;

providing a second wind direction panel which defines a second passage configured to direct the cooling air generated by the cooling fans to a second component, of the plurality of components, having a smaller heating value than the first component and having a lower temperature than the first component, where the second wind direction panel is configured to be integrated with a side wall of the chassis and detachable from the chassis; and cooling the first component and the second component with the cooling air generated by the cooling fans, the cooling air being directed by the first passage and the second passage, wherein the first component is mounted at a position closer to the cooling fans than the second component, wherein the cooling air generated by the cooling fans is divided into a first air quantity passing through the first passage defined by the first wind direction panel and a second air quantity passing through the second passage defined by the second wind direction panel, and wherein the first air quantity is greater than the second air quantity.

7. The method according to claim 6, further comprising:

providing a connecting body which joins the first wind direction panel and the second wind direction panel when the second wind direction panel is integrated with the side wall of the chassis.

8. The method according to claim 6, further comprising:

providing a plurality of storage devices configured to store the data of the external device in the chassis, wherein the cooling fans are disposed between the storage devices and the first and second components, wherein the storage devices are cooled by air taken in from an exterior of the storage subsystem by the cooling fans, and wherein the air having cooled the storage device is blown from the cooling fans to the first component via the first wind direction panel to cool the first component, and to the second component via the second wind direction panel to cool the second component.

9. The method according to claim 8, wherein the first component is a processor configured to control the storage subsystem.

10. The method according to claim 9, wherein the second component is one or more of the following: a volatile memory configured to temporarily store data of the external device, a backup nonvolatile memory configured to store the contents of the volatile memory, a backup battery configured to supply power for storing data to the backup nonvolatile memory when power supply from the exterior to the storage subsystem is cut off, and an expansion board equipped with a communication controller configured to communicate with the external device.

11. A chassis configured to mount a plurality of storage devices, comprising:

a plurality of components disposed in the chassis and configured to be operated to store data in the storage devices;

a plurality of cooling fans disposed in the chassis and configured to generate a cooling air to cool the components;

a first wind direction panel which defines a first passage configured to direct the cooling air generated by the cooling fans to a first component of the plurality of components, and the first wind direction panel is fixed to the chassis;

a second wind direction panel which defines a second passage configured to direct the cooling air generated by the cooling fans to a second component, of the plurality of components, having a smaller heating value than the first component and having a lower temperature than the first component, and the second wind direction panel is configured to be integrated with a side wall of the chassis and detachable from the chassis;

wherein the first component is mounted at a position closer to the cooling fans than the second component, wherein the cooling air generated by the cooling fans is divided into a first air quantity passing through the first passage defined by the first wind direction panel and a second air quantity passing through the second passage defined by the second wind direction panel, and wherein the first air quantity is greater than the second air quantity.

12. The chassis according to claim 11, further comprising:

a connecting body configured to join the first wind direction panel and the second wind direction panel when the second wind direction panel is integrated with the side wall of the chassis.

13. The chassis according to claim 11, wherein the plurality of storage devices are loaded in the chassis, wherein the cooling fans are disposed between the storage devices and the first and second components, wherein the storage devices are cooled by air taken in from an exterior of the storage subsystem by the cooling fans, and wherein the air having cooled the storage device is blown from the cooling fans to the first component via the first wind direction panel to cool the first component, and to the second component via the second wind direction panel to cool the second component.

14. The chassis according to claim 13, wherein the first component is a processor configured to control the storage subsystem.

15. The chassis according to claim 14, wherein the second component is one or more of the following: a volatile memory configured to temporarily store data of the external device, a backup nonvolatile memory configured to store the contents of the volatile memory, a backup battery configured to supply power for storing data to the backup nonvolatile memory when power supply from the exterior to the storage subsystem is cut off, and an expansion board equipped with a communication controller configured to communicate with the external device.

* * * * *